United States Patent

Test et al.

[11] Patent Number: 5,544,804
[45] Date of Patent: Aug. 13, 1996

[54] CAPILLARY DESIGNS AND PROCESS FOR FINE PITCH BALL BONDING

[75] Inventors: Howard R. Test, Plano, Tex.; Michael R. Vinson, Lansdale, Pa.; Albert H. Kuckhahn, Frisco, Tex.

[73] Assignee: Texas Instruments Incorporated, Dallas, Tex.

[21] Appl. No.: 255,582

[22] Filed: Jun. 8, 1994

[51] Int. Cl.⁶ .................................. B23K 20/10
[52] U.S. Cl. ........................ 228/180.5; 228/4.5
[58] Field of Search ................... 228/180.5, 4.5, 228/44.7

[56] References Cited

FOREIGN PATENT DOCUMENTS 54-128271 10/1979 Japan ........................... 228/4.5
4-28241 1/1992 Japan ......................... 228/180.5

Primary Examiner—P. Austin Bradley
Assistant Examiner—Jeffrey T. Knapp
Attorney, Agent, or Firm—W. James Brady, III; Richard L. Donaldson

[57] ABSTRACT

A capillary tube (1) for bonding wire (5) has a bore (3) and a cross section in a direction normal to the bore having a long dimension and a short dimension in a direction normal to the long dimension. The bond is made to bond pads (9) using the capillary tube by bonding a wire to one bond pad while the capillary is oriented with the long dimension (25 to 27 or 35 to 37) in a first direction and bonding a wire to a die immediately adjacent the one bond pad with the capillary which can be oriented with the long dimension in the same direction or in a direction normal to the first direction, as may be required.

10 Claims, 2 Drawing Sheets

CAPILLARY DESIGNS AND PROCESS FOR FINE PITCH BALL BONDING

BACKGROUND OF THE INVENTION

1. Field of the Invention

This invention relates to capillaries and the design thereof for use in conjunction with wire bonding to the bond pads of semiconductor devices and a method of forming the bond.

2. Brief Description of the Prior Art

Ball bonding is a widely used technique in semiconductor fabrication to connect the internal semiconductor die to the external leads. In this procedure, a fine gold wire, usually about 25 µm (0.0010 inch) to about 30 µm (0.0013 inch) is fed down through a ceramic capillary, generally alumina, having an entry aperture at the top and an exit aperture at the opposite end of a bore therein. A ball is formed external to the exit aperture by an electronic flame off (EFO) mechanism that melts a small portion of the wire remaining after the previous bond. Essentially, the ball is formed at the end of the wire by an electric discharge spark. At this time, the capillary is relatively far from the ball (millimeters distant). The wire is restrained from moving by a tensioner until the ball is centered in the chamfer diameter of the capillary and is forced downward by the continued motion of the capillary toward the bond pad on the die. The ball is placed on a bond pad of the semiconductor device being assembled and the capillary end then forces the ball against the pad to provide the bond in conjunction with thermosonic energy.

The above described ball bonding step presents a major obstacle to gold wire ball bonding in integrated circuits with the bond pads closer than approximately 100 µm (0.0039 inch) due to the diameter of the capillary. As the pad-to-pad pitch of semiconductor devices decreases, there is less room for the capillary to make a ball and bond the ball and attached wire to a pad without interfering with the ball and wire on an adjacent pad. Current fine-pitch gold ball bonding uses a fine pitch or "bottlenose" capillary that allows finer pitch bonding than is possible with a standard capillary. However, it is not possible to shrink the capillary diameter sufficiently to produce bond pitches below approximately 90 µm (0.0035 inch) without causing stitch bond strength degradation. The reason for this stitch bond strength degradation is that the dimensions of the face of the capillary that forms the stitch bond shrink as the capillary diameter shrinks, thereby reducing the area in which the stitch is formed. Also, great stress is placed on the capillary bond face during the stitch bond. The capillary bond tip is literally forced into the leadframe, leaving an imprint of the capillary tip in the lead finger, thereby presenting the same problem as discussed above with regard to the ball bond. Additionally, capillary cost increases due to reduced manufacturing yields and capillary life is reduced because the capillary with reduced diameter is more fragile than a standard capillary. It is therefore apparent that an improved capillary or an improved technique for making wire bonds to pads of semiconductor devices will be increasingly desirable as the dimensions and spacing of the bond pads shrink.

SUMMARY OF THE INVENTION

In accordance with the present invention, the above described problems inherent in prior art capillaries is minimized by taking advantage of the geometry of a typical bond in that the ball bond is placed on a pad along an edge of the die with bond angles between 45° and 90° to the edge of the die. The term "bond angle" is the angle that the wire makes with the edge of the chip after the bond of the wire to the pad is made and the wire is then drawn out through the capillary and bonded to a lead finger.

Briefly, a capillary having reduced width in two of the opposing ones of four sectors relative to a standard capillary is provided. The four sectors can be but need not be quadrants in that one pair of opposing sectors can be larger than the other pair of opposing sectors. This is preferably accomplished by removal of a part of the outer portion of one pair of opposing sectors, yet leaving a sufficiently thick wall in each of those opposing sectors to withstand the pressures to be applied to those walls. The preferred shape of the capillary tip portion is that of a bow tie. A desired property of the capillary tip shape is that the thick sectors of the capillary tip should be shaped to fit at least partially around the ball bond previously formed on an adjacent bond pad and spaced therefrom.

In production, either two such capillaries, oriented at right angles to each other, or a single capillary capable of being rotated by ninety degrees (90°), is required to realize the four sector reduced pitch capability. By reducing the width and not the length of the bonding area of the capillary, the distance to an adjacent ball can be reduced without degrading the quality of the stitch bond.

Two capillaries are used, one with its major axis parallel (longitudinal orientation) to the ultrasonic energy (Y direction with respect to the leadframe), the other with its major axis perpendicular (transverse orientation) to the ultrasonic energy (X direction with respect to the leadframe). Dual-head bonders, such as, for example, the TI ABACUS AII-ISR, have an advantage over single head bonders since they can be set up with the longitudinally oriented capillary in one bond head and the transversely oriented capillary in the other bond head. Therefore, with the dual-head bonder, each device can be bonded in a single pass through the bonder. Single headed bonders can use this approach by making a pass with the capillary set in one orientation and then changing the orientation of the capillary on that bonder before making a second pass or, alternatively, by using another bonder to make a second pass with the capillary set at the other orientation. Two single head bonders can be physically linked to automatically transport the leadframe being bonded from the first to the second bonder to eliminate manual handling of the leadframe strips between bonders and producing higher quality, more reliable product.

In the case of the first embodiment of the invention, wires with bond angles close to 90° to the edge of the die produce stitch bonds substantially identical to bonds made with standard capillaries. However, as bond angles move toward 45°, the face presented to the wire during stitch bonding appears modified. Degradation in key bond characteristics can be minimal and acceptable for producing high quality, reliable bonds in most applications. This embodiment of the invention is particularly suitable for orthogonal fine pitch bonding, bond angles near 90°. A modification of the capillary from that having flattened opposing sides in the thinned sectors to a bow tie configuration minimizes and possibly eliminates this effect by presenting a uniformly wide bond face and larger outside radius that produces stitch bonds substantially identical to those produced by a standard capillary. The bow tie configuration can produce the smallest ball bond pitch possible.

DESCRIPTION OF THE PREFERRED EMBODIMENT

Figure 1:
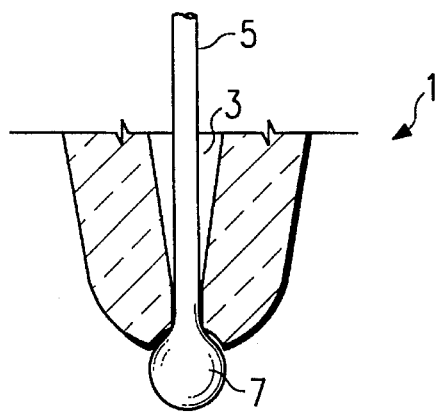
FIG. 1 is a vertical cross-section of the tip portion 1 of a standard prior art capillary with a wire and ball.
Figure 2:
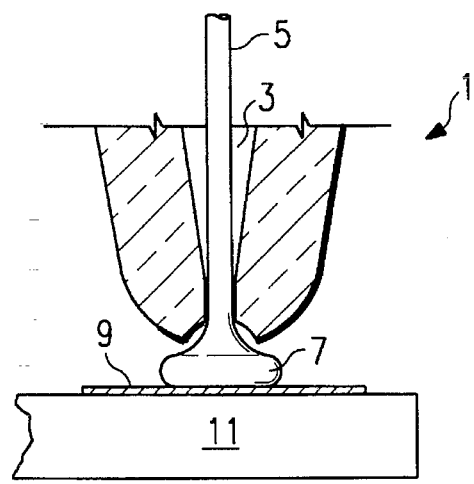
FIG. 2 is a vertical cross-section as in FIG. 1 after the ball has been bonded to a bond pad.

Referring first to FIG. 1, there is shown a vertical cross-section of the tip portion 1 of a standard prior art capillary which is generally circular in horizontal cross-section and has a central bore 3. A gold wire 5 is disposed in the bore and has formed into a ball 7 which is disposed in a chamfer at the bottom portion of the bore 3. A bond is made as shown in FIG. 2 by lowering the ball 7 of FIG. 1 against the pad 9 of the die 11 and applying an ultrasonic pulse and pressure from the capillary tip impinging on the ball to cause the ball to be flattened against and bond to the die pad. The capillary is then lifted away from the die pad and travels to the next wire bonding position. As can be seen, as the dimensions of bond pads 9 decrease and the distance between bond pads decreases, it becomes necessary to reduce the horizontal cross-section of the capillary 1. As noted above, with continued cross-section dimension reduction, ultimately the capillary wall becomes too thin to provide the required force to the ball 7 as shown in FIGS. 1 and 2, yet avoid destruction in the process. Also, due to the reduced distance between die pads, the capillary dimensions can be such to cause the capillary to interfere with the bonds on an adjacent bond pad.

Figure 3:
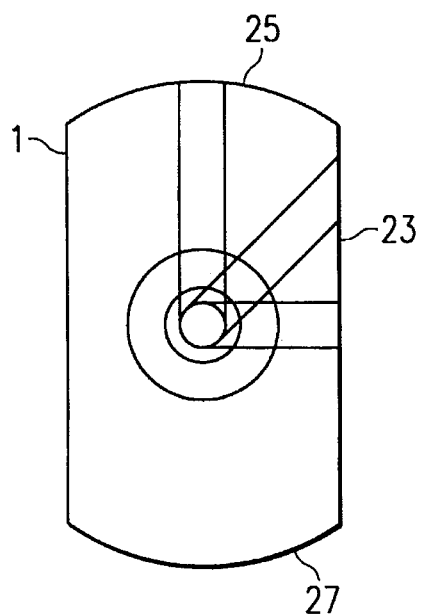
FIG. 3 is a cross-sectional view of the tip portion of a capillary in accordance with a first embodiment of the invention.

The above problem is alleviated in accordance with a first embodiment of the invention as shown in FIG. 3 wherein the horizontal cross-section of the capillary tip is altered so that an opposing pair of sectors 21 and 23, assuming four sectors, is flattened while the same dimension as provided in the prior art capillaries is retained in the unflattened direction. Accordingly, the dimensions between walls 21 and 23 is much smaller than the dimension of a diameter between circular portions 25 and 27.

Figure 4:
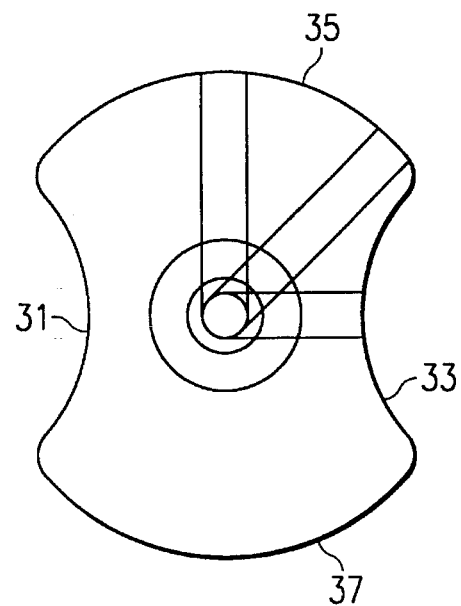
FIG. 4 is a cross-sectional view of the tip portion of a capillary in accordance with a second embodiment of the invention.

Referring now to FIG. 4, there is shown a bow-tie configuration wherein the wall 31 and 33 of the portion of the opposing pair of sectors that has been removed is somewhat circular in nature. However, it should be understood that the geometry of the walls 31 and 33 can be of any shape, it merely being necessary that the walls 35 and 37 be capable of fitting at least partially around and spaced from a previously bonded ball on an adjacent bond pad. The degree of such fit required will depend upon the dimensions of the capillary and the distance between bond pads.

Figure 5:
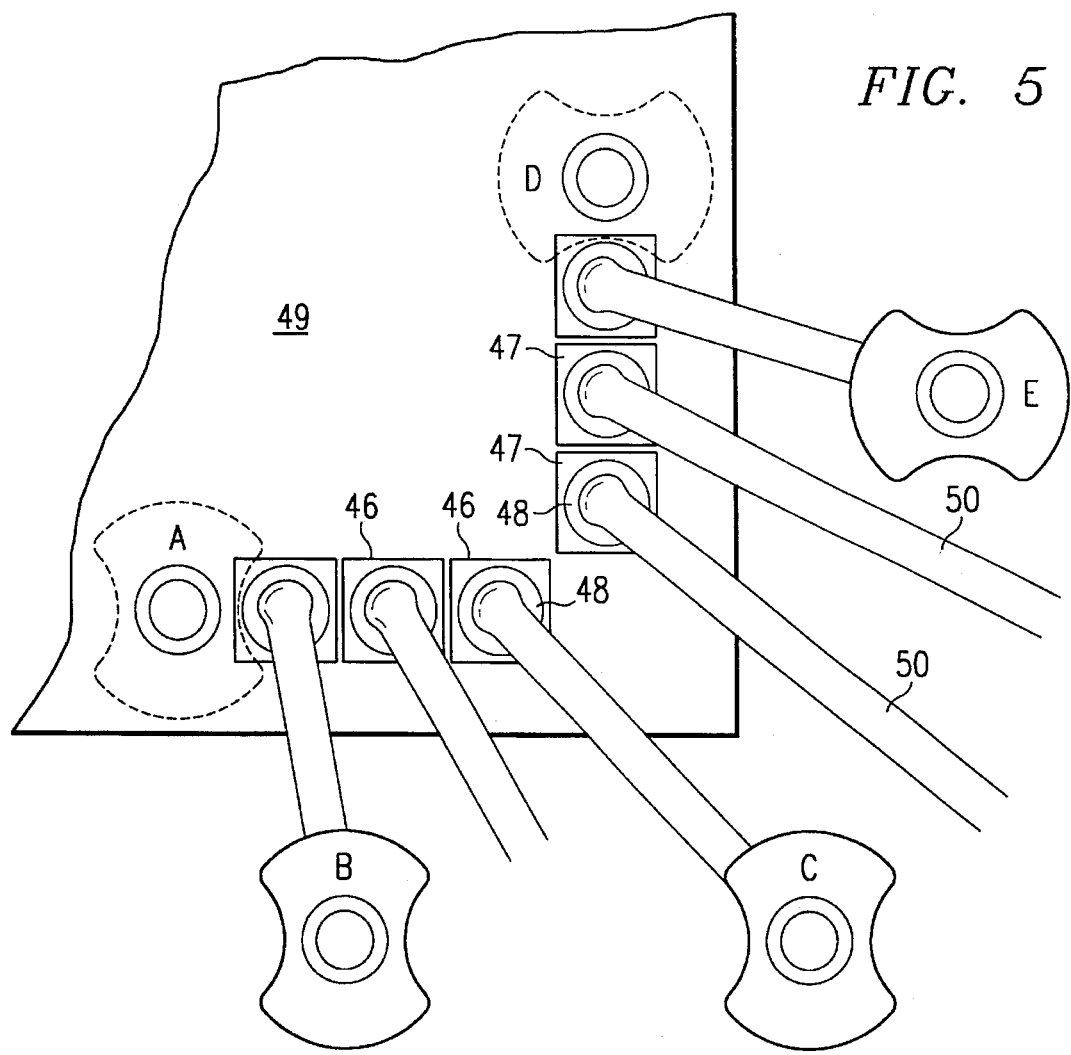
FIG. 5 is a schematic representation of important capillary positions required to realize the full potential of the capillary design and bond process.

The second embodiment of the invention is shown in typical bonding positions in FIG. 5. the positions A, B and C show the capillary in the longitudinal orientation while positions D and E show the capillary in the transverse orientation. The capillary places ball bonds 48 on bond pads 46 and 47 which are located on the surface of the silicon die 49. Bond wires 50 are shown running between bond pads 48 and package leads (not shown).

A ball bond is placed on the bond pad in capillary position A. Upon completion of the ball bond, the capillary is moved by the bond head of the bonder to a position similar to and adjacent to capillary position B, where a stitch bond is made to a package lead. Capillary position B represents a case where the bond angle is close to 90 degrees with respect to the edge of die 49. In this case, both embodiments of this invention produce high quality ball and stitch bonds. Capillary position C represents a case where the bond angle is close to 45 degrees. In this case, the second embodiment of this invention, the bow tie configuration, produces superior stitch bonds with respect to the first embodiment of the invention.

Capillary position D represents a case where the ball bond is made on a side of the die 49, perpendicular to ball bonds placed by the capillary in position A. Capillary position E represents a stitch bond along the side of the die 49 perpendicular to the stitch bonds made in capillary positions B and C. It is the intention that this bonding process continue along each edge of the die 49 until all bonds are completed. All bonds along the side represented by capillary position A and the side opposite this side are accomplished by the capillary oriented as in position A. Likewise, all bonds along the side represented by capillary position D and the side opposite this side are accomplished by the capillary oriented as in position D.

Figure 6:
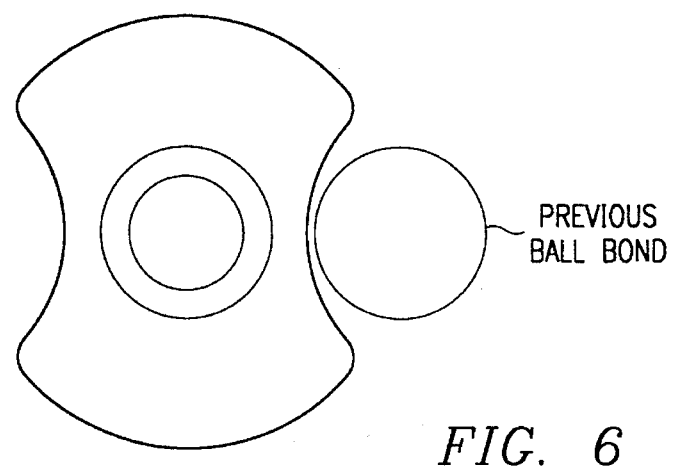
FIG. 6 is a diagram showing capillary oriented to avoid contacting a previously formed ball bond while the capillary is making a bond at a pad thereunder.

Referring now to FIG. 6, there is shown how a capillary 51 is oriented to avoid contacting a previously formed ball bond 53 while the capillary 51 is making a bond at a pad thereunder.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modification.

We claim:

1. A capillary for bonding wire comprising:
   (a) a rigid tubular member having a wall portion and a central bore therethrough;
   (b) said wall portion having two pairs of opposing sectors;
   (c) the shortest dimension through the center of said bore and normal to said bore between the exterior walls of one of said pairs of opposing sectors being substantially greater than the shortest dimension through the center of said bore and normal to said bore between the exterior walls of the other of said pairs of opposing sectors; wherein one of the pair of walls of one of said pairs of opposing sectors extends inwardly toward said bore and the other of said pairs of opposing sectors extends outwardly away from said bore.

2. The capillary of claim 1 wherein each of said sectors of each of said pair of sectors has substantially the same shape of the other sector of the same pair of sectors.

3. The capillary of claim 1 wherein said one of said pair of walls of one of said pairs of opposing sectors extending inwardly toward said bore is concave toward said bore and the other of said pairs of opposing sectors extending outwardly away from said bore is convex toward said bore.

4. The capillary of claim 3 wherein each of said sectors of each of said pair of sectors has substantially the same shape of the other sector of the same pair of sectors.

5. A capillary for bonding wire comprising:

(a) a rigid tubular member having a wall portion and a central bore therethrough, (b) said wall portion having the general cross-sectional shape of a bow tie.

6. A method of forming bonds to bond pads comprising the steps of:

(a) providing at least one capillary having a bore and a cross section in a direction normal to said bore having a long dimension and a short dimension in a direction normal to said long dimension;

(b) bonding a wire to one of said bond pads with a said capillary oriented with said long dimension in a first direction; and (c) bonding a wire to a bond pad immediately adjacent said one of said bond pads, wherein said capillary has an external shape generally that of a bow tie.

7. The method of claim 6 wherein said step of bonding a wire to a bond pad immediately adjacent said one of said bond pads is with said capillary oriented with said long dimension in a direction normal to said first direction.

8. The method of claim 6 wherein said capillary is a rigid tubular member having a wall portion and said bore therethrough, said wall portion having two pairs of opposing sectors, said wall portion having two pairs of opposing sectors, one of said pairs of opposing sectors having said short dimension therebetween in a line through the center of said bore and normal to said bore and the other of said pairs of opposing sectors having said long dimension therebetween in a line through the center of said bore and normal to said bore.

9. The method of claim 8 wherein said wall portions of said one of said pairs of opposing sectors are generally circular and concave inwardly toward said bore and said wall portions of said other of said pairs of opposing sectors are generally circular and concave outwardly away from said bore.

10. A method of forming bonds to bond pads comprising the steps of:

(a) providing at least one capillary having a bore and a cross section in a direction normal to said bore having a long dimension and a short dimension in a direction normal to said long dimension;

(b) bonding a wire to one of said bond pads with a said capillary oriented with said long dimension in a first direction; and (c) bonding a wire to a bond pad immediately adjacent said one of said bond pads, wherein said capillary is a rigid tubular member having a wall portion and said bore therethrough, said wall portion having two pairs of opposing sectors, said wall portion having two pairs of opposing sectors, one of said pairs of opposing sectors having said short dimension therebetween in a line through the center of said bore and normal to said bore and the other of said pairs of opposing sectors having said long dimension therebetween in a line through the center of said bore and normal to said bore, wherein said wall portions of said one of said pairs of opposing sectors are generally circular and concave inwardly toward said bore and said wall portions of said other of said pairs of opposing sectors are generally circular and concave outwardly away from said bore.

* * * * *